(12) United States Patent
Fan et al.

(10) Patent No.: US 9,812,478 B2
(45) Date of Patent: Nov. 7, 2017

(54) AEROGEL-ENCAPSULATED IMAGE SENSOR AND MANUFACTURING METHOD FOR SAME

(71) Applicant: OmniVision Technologies, Inc., Santa Clara, CA (US)

(72) Inventors: Chun-Sheng Fan, Zhudong Township (TW); Wei-Feng Lin, HsinChu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/639,610

(22) Filed: Mar. 5, 2015

(65) Prior Publication Data
US 2016/0260760 A1    Sep. 8, 2016

(51) Int. Cl.
*H01L 31/0216* (2014.01)
*H01L 27/146* (2006.01)

(52) U.S. Cl.
CPC .. *H01L 27/14618* (2013.01); *H01L 27/14636* (2013.01); *H01L 27/14698* (2013.01); *H01L 27/14627* (2013.01); *H01L 2224/11* (2013.01); *H01L 2224/48091* (2013.01); *H01L 2224/48227* (2013.01)

(58) Field of Classification Search
None
See application file for complete search history.

(56) References Cited

U.S. PATENT DOCUMENTS

| 5,656,848 | A | * | 8/1997 | Beratan | G01J 5/20 257/444 |
|---|---|---|---|---|---|
| 6,515,269 | B1 | * | 2/2003 | Webster | H01L 27/14618 250/208.1 |
| 7,105,904 | B2 | | 9/2006 | Choi | |

(Continued)

FOREIGN PATENT DOCUMENTS

TW    200805640 A    1/2008

OTHER PUBLICATIONS

"Silica Aerogel (TEOS, Base-Catalyzed)", Aerogel.org, pulled from https://web.archive.org/web/20141029214506/http://www.aerogel.org/?p=1027, Oct. 29, 2014, 11 pp.

(Continued)

*Primary Examiner* — Ali Naraghi
(74) *Attorney, Agent, or Firm* — Lathrop Gage LLP

(57) ABSTRACT

An aerogel-encapsulated image sensor includes a device die with an image sensor fabricated thereon and an aerogel layer that encapsulates the image sensor. A method for encapsulating image sensor pixel arrays of respective bare image sensors formed on a sensor array sheet may include injecting an uncured aerogel portion on each image sensor pixel array, and curing each uncured aerogel portion. The step of curing may include at least one of (a) super-critical drying, (b) surface-modification drying, and (c) pinhole drying an uncured aerogel portion. The method may further include singulating the sensor array sheet into a plurality of aerogel-encapsulated image sensors. A method for encapsulating image sensor pixel arrays of respective bare image sensors (Continued)

on a device wafer may include forming an aerogel layer on each bare image sensor. The step of forming may include at least one of spin-coating, dip-coating, and spray-coating the aerogel layer.

10 Claims, 14 Drawing Sheets

(56)  References Cited

U.S. PATENT DOCUMENTS

| | | | |
|---|---|---|---|
| 8,461,223 | B2 | 6/2013 | Lee et al. |
| 2007/0120160 | A1* | 5/2007 | Hsu ................... H01L 27/1463 257/292 |
| 2008/0014673 | A1 | 1/2008 | Chiang et al. |
| 2008/0303107 | A1* | 12/2008 | Minamio ........ H01L 27/14618 257/432 |
| 2012/0038015 | A1* | 2/2012 | Huang ............ H01L 27/14625 257/437 |
| 2012/0112223 | A1* | 5/2012 | Kuo .................... H01L 33/644 257/98 |
| 2012/0280346 | A1* | 11/2012 | Hung .............. H01L 27/14621 257/432 |

OTHER PUBLICATIONS

"Silica Aerogel (TMOS,Base-Catalyzed)", Aerogel.org, pulled from https://web.archive.org/web/20141031012258/http:/www.aerogel.org/?p=1406, Oct. 31, 2014, 5 pp.
Barty, et al., "Three-Dimensional Coherent X-Ray Diffraction Imaging of a Ceramic Nanofoam: Determination of Structural Deformation Mechanisms", The American Physical Society, Physical Review Letters, PRL 101, 055501 (2008), 055501-1-055501-4.
Chaichanawong, et al., "Preparation of Carbon Aerogel Microspheres by a Simple-Injection Emulsification Method", Advanced Powder Technology 24 (2013) 891-896.
Yang, "Fabrication and Preliminary Characterization of Hydrophobic Silica Aerogel Films for Oil Remediation Studies", Pomona College, Claremont, California, 45 pp.
Ginneken, et al., "Synthesis, Characterisation and Applications of Silica Aerogels", 6th International Symposium on Supercritial Fluids, Versailles, France, Apr. 28, 2003, Mn2, 6 pp.
Gurav, et al., "Silica Aerogel: Synthesis and Applications", Journal of Nanomaterials, vol. 2010, Article ID 409310, 2010, 11 pp.
Hrubesh, "Aerogel Applications", Journal of Non-Crystalline Solids 225 (1998) 335-342.
Hrubesh, et al., "Processing and Characterization of High Porosity Aerogel Films", MRS Conference, Boston, MA, UCRL-JC-117554, CONF-941144-176, 1994, 13 pp.
Rouquerol, et al., "Recommendations for the Characterization of Porous Solids", Pure & Appl. Chem., vol. 66, No. 8, pp. 1739-1758, 1994.
Li, et al., "A novel three-dimensional aerogel biochip for molecular recognition of nucleotide acids", Acta Biomaterialia 6 (2010) 1462-1470.
"SilicaAeroGels", Microstructured Materials Group, E.O. Lawrence Berkeley National Laboratory, 2013, pulled from https://web.archive.org/web/20130103234300/http://energy.lbl.gov/ecs/aerogels/sa-physical.html, 1 page.
"Aerogel Mystifying Blue Smoke Fact Sheet", NASA JPL 400-1119, pulled from https://web.archive.org/web/20141028192949/http://stardust.jpl.nasa.gov/aerogel_factsheet.pdf, accessed Oct. 28, 2014.
Norris, et al., "Aerogels: Unique Material, Fascinating Properties and Unlimited Applications", Annual Review of Heat Transfer, vol. 14, Begell House Inc., New York, 2005, pp. 385-408.
Norris, "Aerogel: A Nanostructured Material with Fascinating Properties and Unlimited Applications", 2011, pulled from https://web.archive.org/web/20140926054732/http://www.seas.virginia.edu/admin/diversity/k12/Presentations/AerogelGeneral2011-PamNorris.pdf, accessed Sep. 26, 2014, 35 pp.
Obrey, et al., "Ultra-thin Aerogel Films", Los Alamos National Laboratory, 20th Target Fabrication Meeting, Santa Fe, NM, May 22, 2012, LA-UR 11-05466, pulled from https://web.archive.org/web/20141218184941/http://www.lanl.gov/conferences/tfm/presentations/08-22-12-PM1-1-0brey.pdf, accessed Dec. 18, 2014, 20 pp.
Pierre, et al., "SiO2 Aerogels", Aerogels Handbook, M.A. Aegertr et al. (eds.), Springer Science & Business Media, 2011, pp. 21-45.
Tabata, et al., "Development of Silica Aerogel with Any Density", 2005 IEEE Nuclear Science Symposium Conference Record N14-191, pp. 816-818.
Tabata, et al., "Status of Aerogel Radiator with High Refractive Indices", submission to Nuclear Instruments and Methods, Mar. 10, 2010, 4 pp.
Tabata, "Recent Progress in Silica Aerogel Cherenkov Radiator", JAXA TIPP Chicago 2011, 33 pp.
Tabata, et al., "Optical and Radiographical Characterization of Silica Aerogel for Cherenkov Radiator", IEEE Transactions on Nuclear Science 2012, pp. 1-7.
"What is Aerogel?", pulled from https://web.archive.org/web/20130810014129/http://www.aerogel.org/?p=3, accessed Aug. 10, 2013, 7 pp.
Translation of the first Office Action corresponding to Taiwanese Patent Application No. 105106752, dated Nov. 9, 2016, 3 pages.
Translation of the second Office Action corresponding to Taiwanese Patent Application No. 105106752, dated May 15, 2017, 3 pages.

* cited by examiner

AEROGEL-ENCAPSULATED IMAGE SENSOR AND MANUFACTURING METHOD FOR SAME

BACKGROUND

The present invention relates to image sensors, and specifically, the encapsulation of a pixel array of an image sensor.

Camera modules in products such as stand-alone digital cameras, mobile devices, automotive components, and medical devices often include a complementary metal-oxide-semiconductor (CMOS) image sensor. The CMOS image sensor converts light imaged by a camera lens into a digital signal that is converted into a displayed image and/or file containing the image data. The CMOS image sensor includes a pixel array and a corresponding microlens array, wherein each pixel includes a respective microlens that focuses light on it. Contaminants incident on a microlens can adhere to it and render the associated pixel inoperable.

SUMMARY OF THE INVENTION

In an embodiment, an aerogel-encapsulated image sensor includes a device die with an image sensor fabricated thereon and an aerogel layer that encapsulates the image sensor.

In another embodiment, a method for encapsulating image sensor pixel arrays of respective bare image sensors formed on a sensor array sheet may include a step of injecting an uncured aerogel portion on each image sensor pixel array, and a step of curing each uncured aerogel portion. The step of curing may include at least one of (a) super-critical drying, (b) surface-modification drying, and (c) pinhole drying an uncured aerogel portion. The method may further include singulating the sensor array sheet into a plurality of aerogel-encapsulated image sensors.

In another embodiment, a method for encapsulating image sensor pixel arrays of respective bare image sensors on a device wafer may include forming an aerogel layer on each bare image sensor. The step of forming may include at least one of spin-coating, dip-coating, and spray-coating the aerogel layer on the bare image sensor. The step of forming may include at least one of (a) super-critical drying, (b) surface-modification drying, and (c) pinhole drying a solvent-filled gel film. The method may further include singulating the device wafer to form a plurality of aerogel-encapsulated image sensor dies.

DETAILED DESCRIPTION

Figure 1:
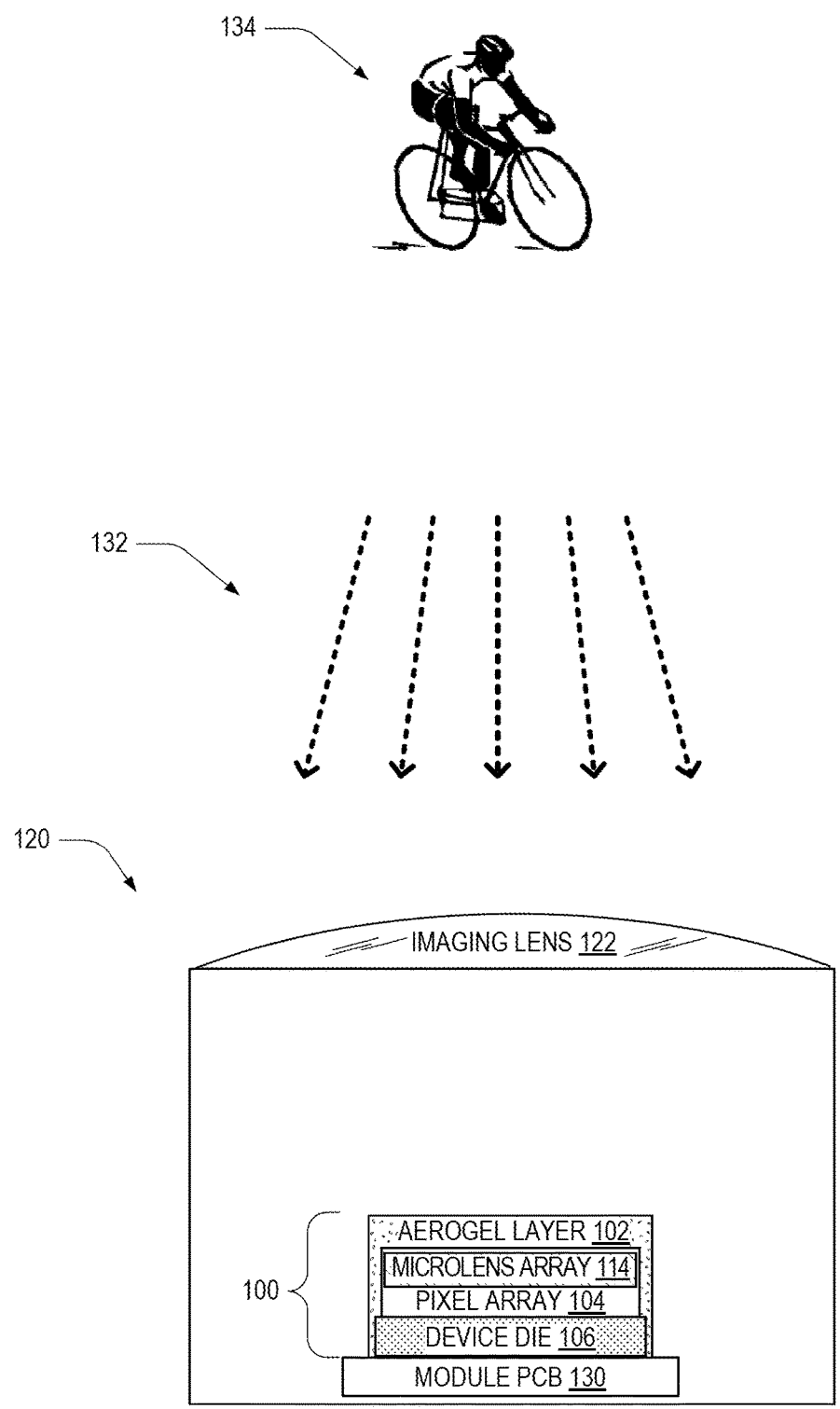
FIG. 1 shows an exemplary aerogel-encapsulated image sensor of a camera that is imaging an object onto a pixel array, in an embodiment.

FIG. 1 shows an exemplary aerogel-encapsulated image sensor 100 of a camera 120 with an imaging lens 122 that is imaging light 132 propagating from an object 134 onto a pixel array 104. Pixel array 104 may include a microlens array 114, wherein each microlens of microlens array 114 is aligned above a respective pixel of pixel array 104. An aerogel layer 102 prevents contaminants from reaching microlens array 114. Encapsulated image sensor 100 may include a device die 106 that is, for example, implemented using CMOS processes, but may be implemented in other technologies without departing from the scope hereof. Device die 106 is electrically connected to a printed circuit board (PCB) 130.

Figure 2:
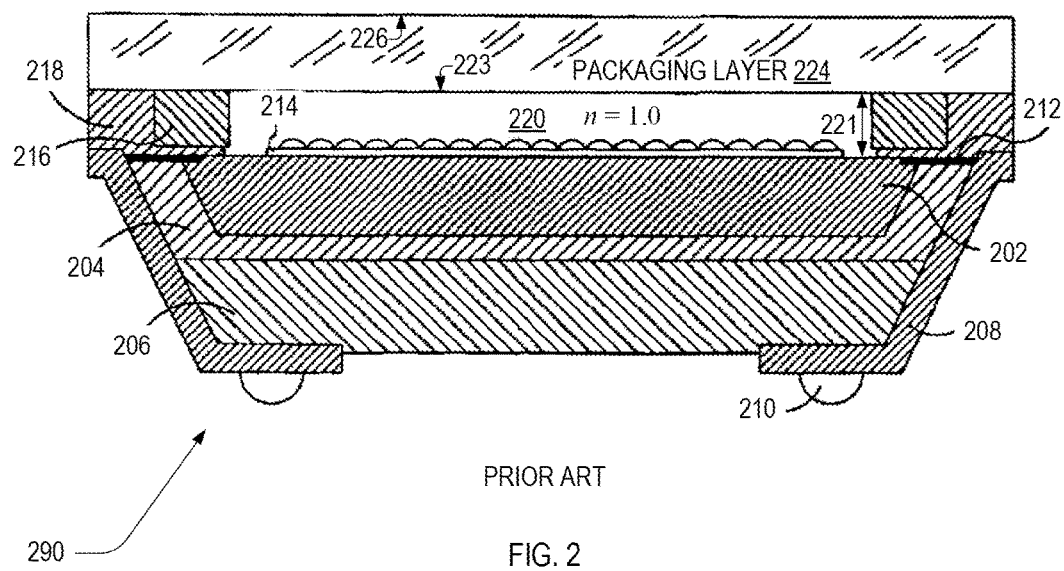
FIG. 2 illustrates a prior-art packaged image sensor designed to protect a microlens array thereof from contaminants.

FIG. 2 illustrates a prior-art packaged image sensor 290 designed to protect a microlens array 214 thereof from contaminants, as disclosed in U.S. Pat. No. 6,777,767 to Badehi. Microlens array 214 is mounted on a substrate 202, which is connected to conductive pads 212. Conductive pads 212 are electrically connected to electrical contacts 208, which are electrically connected to a conducting bump 210. An epoxy 204 bonds substrate 202 to a bottom packaging layer 206. Spacer elements 216 separate a glass packaging layer 224 from microlens array 214, creating a microlens-array cavity 220. Glass packaging layer 224 has a bottom surface 223 and a top surface 226. An epoxy sealant 218 seals cavity 220, which has a cavity height 221. In the direction of cavity height 221, epoxy sealant 218 bridges cavity 220 between packaging layer 224 and electrical contacts 208, and between packaging layer 224 and substrate 202.

A limitation of packaged image sensor 290 are reflections off bottom surface 223 and top surface 226 of glass packing layer 224. Glass packaging layer 224 is between an ambient medium 292 and cavity 220, which are typically air and hence have a refractive index n=1.0. If glass packaging layer 224 has a refractive index $n_2=1.5$, then reflections off of both surfaces 223 and 226 result in glass packing layer 224 reflecting approximately six percent of light incident light, and hence transmitting only approximately ninety-four percent of incident light to microlens array 214.

As an aerogel, aerogel layer 102 has a significantly lower refractive index than glass packaging layer 224. An Aerogel Fact Sheet (JPL 400-119) published by the National Aeronautics and Space Administration (NASA) states that silica ($SiO_2$) aerogels have a refractive index values between $n=1.002$ and $n=1.0046$ at a free-space wavelength of $\lambda_0=632.8$ nanometers. Aerogels with higher refractive indices, up to $n=1.265$ at $\lambda_0=400$ nm, have been produced, as described in M. Tabata, et al., "Development of silica aerogel with any density," in 2005 IEEE Nucl. Sci. Symp. Conf. Rec., pp. 816-818, 2005. At visible wavelengths (between four hundred and seven hundred nanometers in vacuum), aerogel layer 102 may have a refractive index between $n=1.0$ and $n=1.35$, inclusive.

In an embodiment, aerogel layer 102 satisfies a definition of an aerogel defined at aerogel.org: "an open-celled, mesoporous, solid foam that is composed of a network of interconnected nanostructures and that exhibits a porosity (non-solid volume) of no less than 50%." According to a Technical Report by the International Union of Pure and Applied Chemistry (IUPAC), a mesoporous solid is a porous solid with pore widths between two nanometers and fifty nanometers (Pure and Applied Chemistry, Vol. 66, Issue 8, pp. 1739-1758, 1994). Aerogel layer 102 may include micropores (pore widths less than two nanometers) and macropores (pore widths exceeding one hundred nanometers) without departing from the scope hereof.

The IUPAC's Technical Report defines the term width as follows: "the limiting size of a pore, for most phenomena in which porous solids are involved, is that of its smallest dimension which, in the absence of any further precision, is referred to as the width of the pore (i.e. the width of a slit-shaped pore, the diameter of a cylindrical pore . . . )," emphasis in original. Herein, this application adopts the above IUPAC convention for the meaning pore width. Moreover, a diameter of a pore refers to its width. In an embodiment, aerogel layer 102 has a pore size distribution such that at least one of (a) the average pore width and (b) the median pore width is between two nanometers and fifty nanometers.

In an embodiment, aerogel layer 102 is formed of microporous polydicyclopentadiene (polyDCPD), which has been prepared to have pore sizes between one and one hundred nanometers, as described in U.S. Pat. No. 8,461,223 to Lee and Gould. In a different embodiment, aerogel layer 102 is similar to the silica aerogel described by L. Van Ginneken et al. in "Synthesis, Characterisation and Applications of Silica Aerogels," 6th International Symposium on Supercritical Fluids, 2003. The authors prepared silica aerogels with a pore size distribution described as follows: "The largest contribution to the total pore volume comes from pores of radii<2 nm, which amounts to 55% of the total pore volume. Pores of radii 2-5 nm contribute for ca. 24% to the total pore volume, while only a small part of pore volume, ca. 21%, is created by pores with radii>5 nm." For example, aerogel layer 102 may have at least one of (a) an average pore diameter less than fifty nanometers and (b) a median pore diameter less than fifty nanometers.

In an embodiment, aerogel layer 102 may be formed of silica. In an embodiment, aerogel layer 102 has pore diameter ranging from five nanometers to one hundred nanometers, with an average pore diameter between twenty and forty nanometers. For example, aerogel layer 102 may be an aerogel described by A. C. Pierre and A. Rigacci, "$SiO_2$ Aerogels," in Aerogels Handbook, M. A. Aegerter et al. (eds.), Springer, 2011. Aerogel layer 102 may have a density between $1.0 \text{ kg/m}^3$ and $500 \text{ kg/m}^3$. By comparison, silica has a significantly larger density: $2,650 \text{ kg/m}^3$.

In an embodiment, aerogel layer 102 is a porous material that includes a solid network and a gas filler. The solid network may be formed of at least one of silica, alumina and titania and may occupy, by volume, between one percent and ten percent of aerogel layer 102. The gas filler may occupy, by volume, between ninety and ninety-nine percent of aerogel layer 102, and may include a gas species that resist at least one moisture, corrosion, and chemical reaction. Example of such gas species include $N_2$, Ar, other noble gases (He, Ne, Kr, Xe, and Rn), and combinations thereof. Aerogel layer 102 may include surface modification by a silane coupling agent. The silane coupling agent may have a hydrolyzable group such as alkyl, amine, sulfhydryl, carboxyl, and formyl, and may also have a ligand attached thereto.

Figure 3:
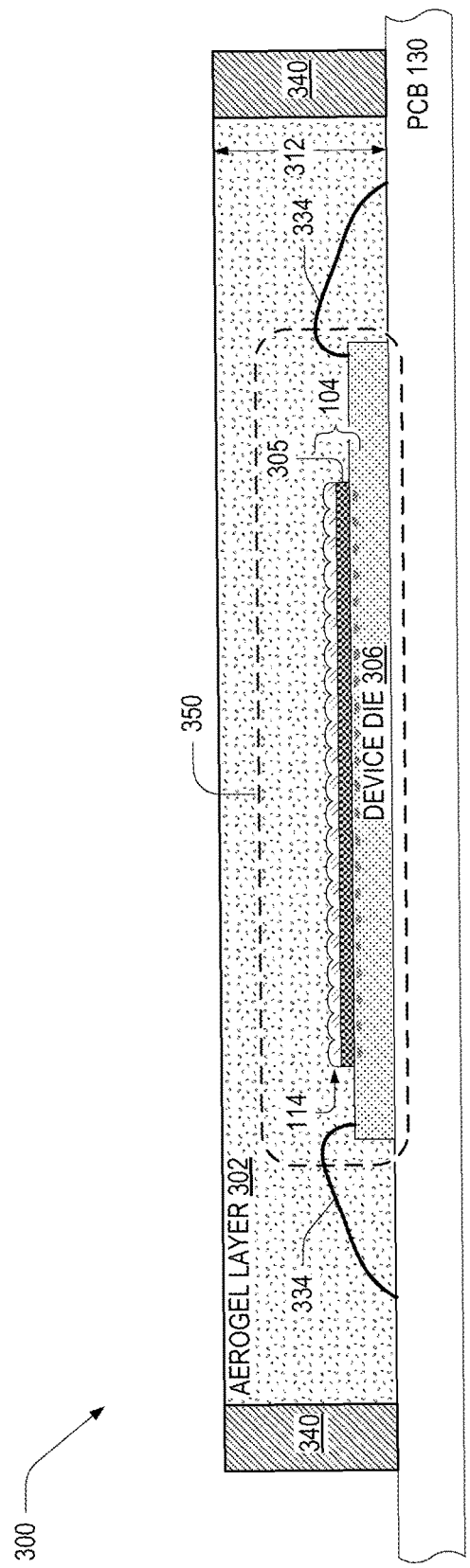
FIG. 3 is a cross-sectional view of an exemplary aerogel-encapsulated image sensor electrically connected to a PCB, in an embodiment.

FIG. 3 is a cross-sectional view of an exemplary aerogel-encapsulated image sensor 300 electrically connected to PCB 130 via wire bonds 334. Aerogel-encapsulated image sensor 300 includes one pixel array 104 formed on a device die 306. A color filter array 305 may be between microlens array 114 and device die 306. An aerogel layer 302 encapsulates pixel array 104. Aerogel layer 302 is similar to aerogel layer 102 and has a thickness 312 that is between five hundred nanometers and two millimeters.

Aerogel-encapsulated image sensor 300 may be viewed as a bare image sensor 350 with aerogel layer 302 thereon. Bare image sensor 350 includes device die 306, pixel array 104, and microlens array 114. Bare image sensor 350 may also include color filter array 305.

Bare image sensor 350 is shown in FIG. 3 as a chip-on-board (COB) package. Alternatively, bare image sensor 350 may include a different device package, such as a plastic leaded chip carrier (PLCC) or a ceramic leadless chip carrier (CLCC), without departing from the scope hereof. Aerogel-encapsulated image sensor 300 may include dam structures 340 adjacent to aerogel layer 302.

Figure 4:
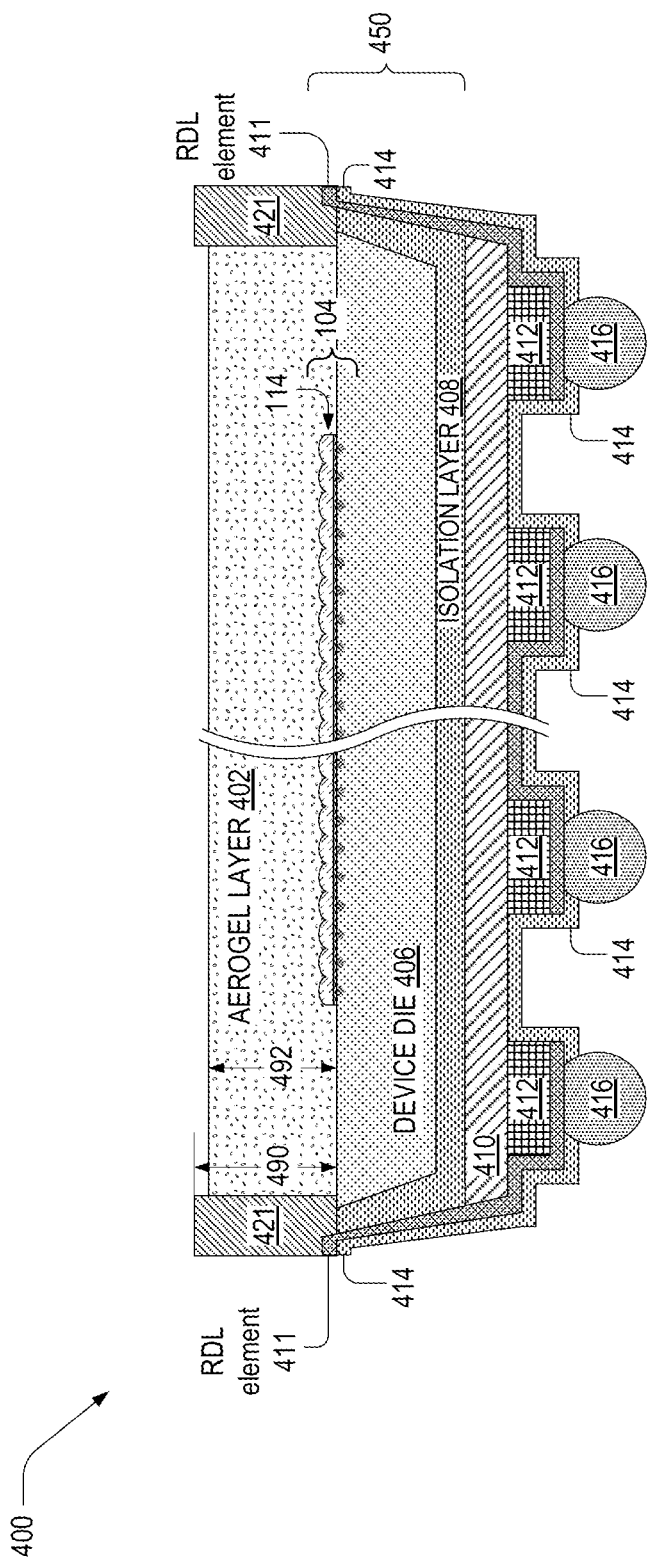
FIG. 4 is a cross-sectional schematic diagram of an exemplary aerogel-encapsulated image sensor die configured with a chip-scale package (CSP), in an embodiment.

FIG. 4 is a cross-sectional schematic diagram of an exemplary aerogel-encapsulated image sensor die 400 configured with a CSP. Aerogel-encapsulated image sensor die 400 includes one pixel array 104 that includes one microlens array 114. A patterned redistribution layer (RDL) 411 electrically connects pixel array 104 with solder balls 416 via dams 421. Dams 421 may include a conductive pad. Patterned RDL 411 may be formed of one or more of Al, an Al—Cu alloy, and Cu, and has a metal finish formed of a nickel layer and a gold layer, as known in the art. In an embodiment, through-silicon vias (TSVs) may replace patterned RDL 411.

An aerogel layer 402 encapsulates pixel array 104 and is similar to aerogel layer 102. In FIG. 4, dams 421 have a height 490 above device die 406 that is greater than or equal to a height 492 of aerogel layer 402. In a different embodiment, dams 421 have a height 490 that is less than height 492. Between device die 406 and solder balls 416 are an isolation layer 408, a layer 410, barrier layers 412, patterned RDL 411, and an isolation layer 414. Layer 410 is formed of glass, for example.

Aerogel-encapsulated image sensor die 400 may be viewed a bare image sensor 450 with aerogel layer 402 thereon. Bare image sensor 450 includes pixel array 104 and device die 406, and may also include other elements of aerogel-encapsulated image sensor die 400, with the exception of aerogel layer 402.

Figure 5:
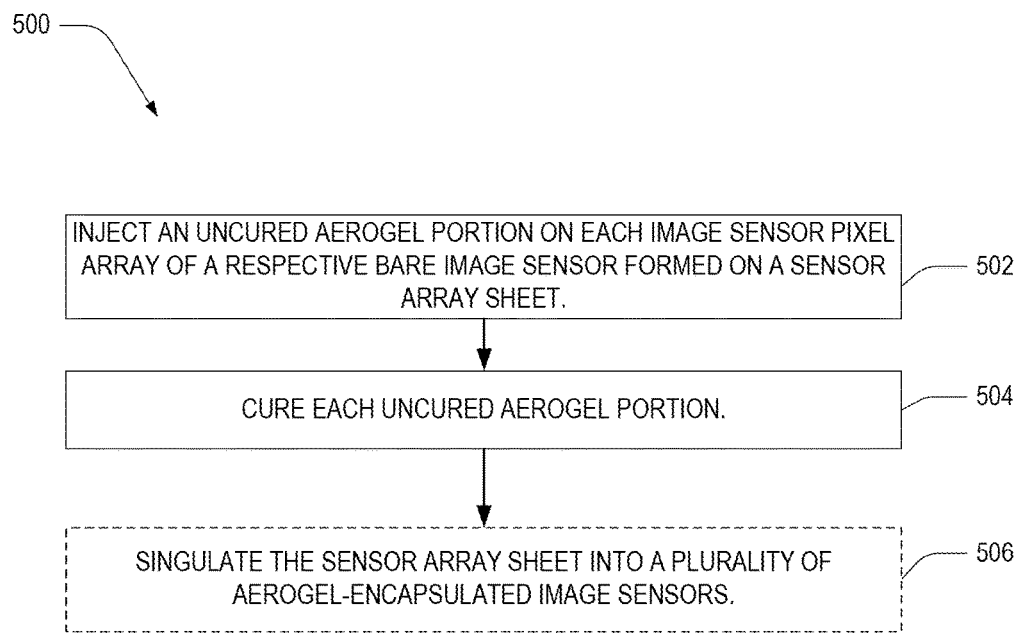
FIG. 5 is a flowchart illustrating an exemplary method for encapsulating an image sensor pixel array, in an embodiment.

FIG. 5 is a flowchart illustrating an exemplary method 500 for encapsulating image sensor pixel arrays of respective bare image sensors formed on a sensor array sheet. Method 500 may be used to fabricate aerogel-encapsulated image sensor 300, for example.

Figure 6:
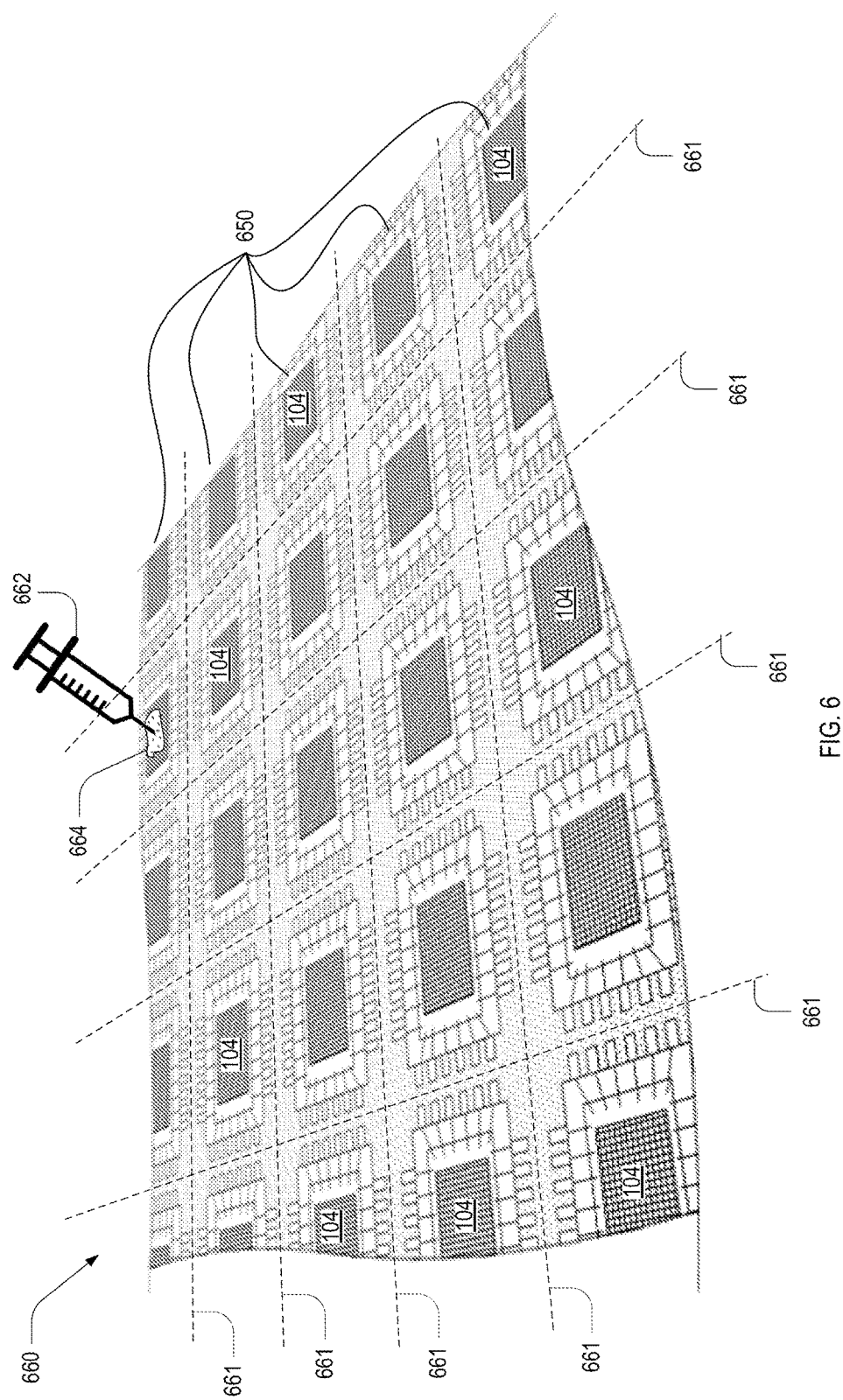
FIG. 6 is a perspective view of an image sensor array sheet that includes a plurality of bare image sensors, in an embodiment.

FIG. 6 is a perspective view of an image sensor array sheet 660 that includes a plurality of bare image sensors 650 that may be encapsulated by an aerogel using method 500. Each bare image sensor 650 includes one pixel array 104, and each bare image sensor 650 may be similar to bare image sensor 350. For clarity of illustration, not all bare image sensors 650 and pixel arrays 104 are labelled in FIG. 6. FIGS. 5 and 6 are best viewed together with the following description.

Referring to method 500, in step 502, method 500 injects an uncured aerogel portion on each pixel array. In an example of step 502, a liquid deposition tool 662 injects an uncured aerogel portion 664 on each pixel array 104 of one bare image sensor 650 on image sensor array sheet 660. Uncured aerogel portion 664 may be a gel prepared using sol-gel chemistry. Uncured aerogel portion 664 may be a colloidal suspension of solid particles and include a metal oxide, for example, at least one of silica, alumina, titania, and zirconia. See, for example, P. M. Norris and S, Shrinivasan, "Aerogels: Unique Material, Fascinating Properties & Unlimited Applications," Annual Review of Heat Transfer, Vol. 14, pp. 385-408 (2005), and references therein.

In step 504, method 500 cures each uncured aerogel portion. In an example of step 504, uncured aerogel portion 664 are cured, or dried, using a method known in the art of aerogel processing, such as super-critical drying or surface-modification drying. In an embodiment of method 500, step 504 employs a pinhole drying method as described by the aforementioned reference by Tabata. Step 504 may also include a mold process for ensuring that the cured aerogel portions have a roughness less than a predetermined value.

Step 506 is optional. If included, in step 506, method 500 singulates the sensor array sheet into a plurality of aerogel-encapsulated image sensors. In an example of step 506, image sensor array sheet 660 is singulated along dicing lines 661 to form a plurality of aerogel-encapsulated image sensors 300.

Figure 7:
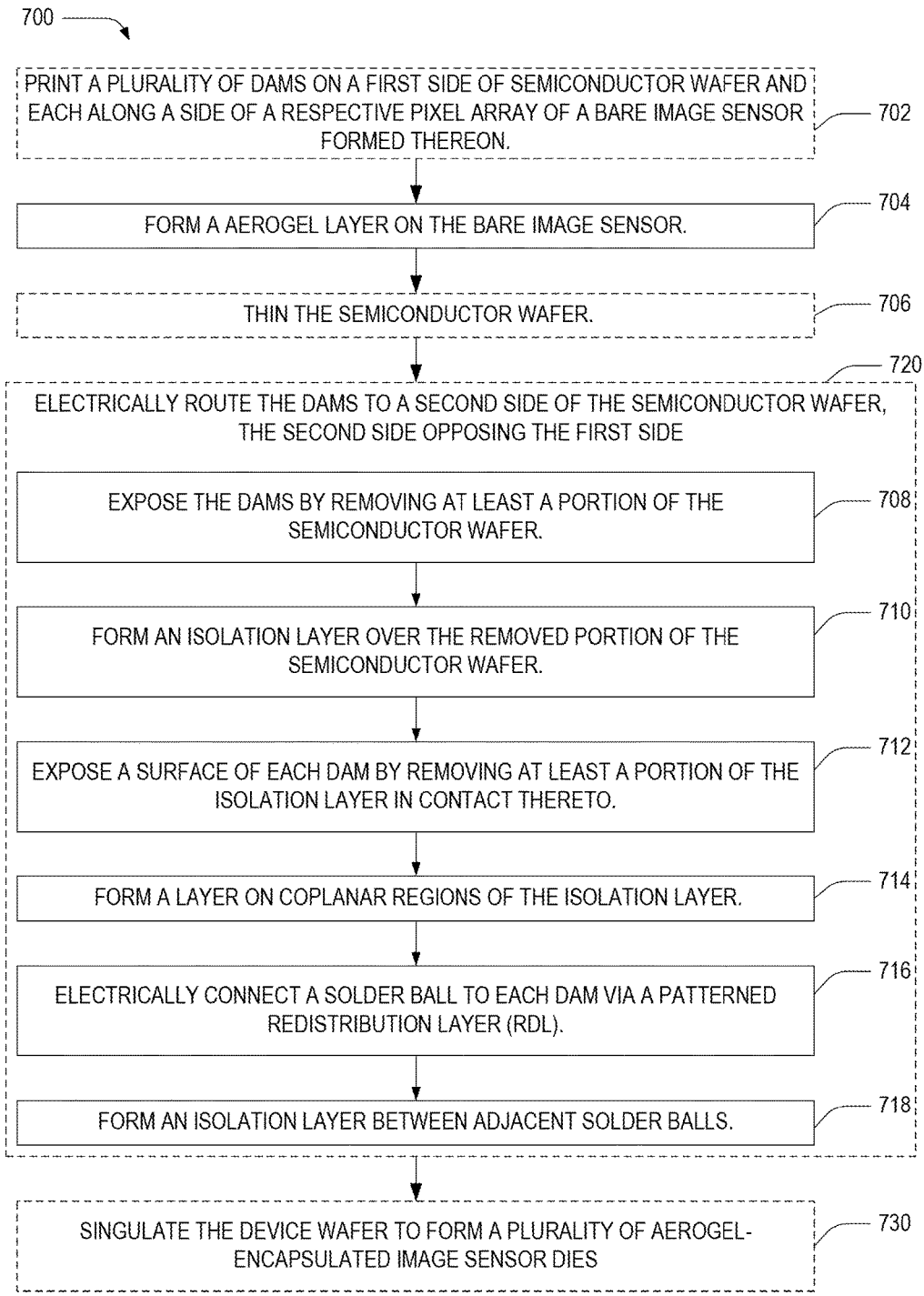
FIG. 7 is a flowchart illustrating an exemplary method for encapsulating an image sensor pixel array, in an embodiment.

FIG. 7 is a flowchart illustrating an exemplary method 700 for encapsulating an image sensor pixel array. FIGS. 8-14 illustratively represent the results of method 700. FIG. 7 and FIGS. 8-14 are best viewed together with the following description. Method 700 may be used to fabricate aerogel-encapsulated image sensor die 400, for example.

Figure 8:
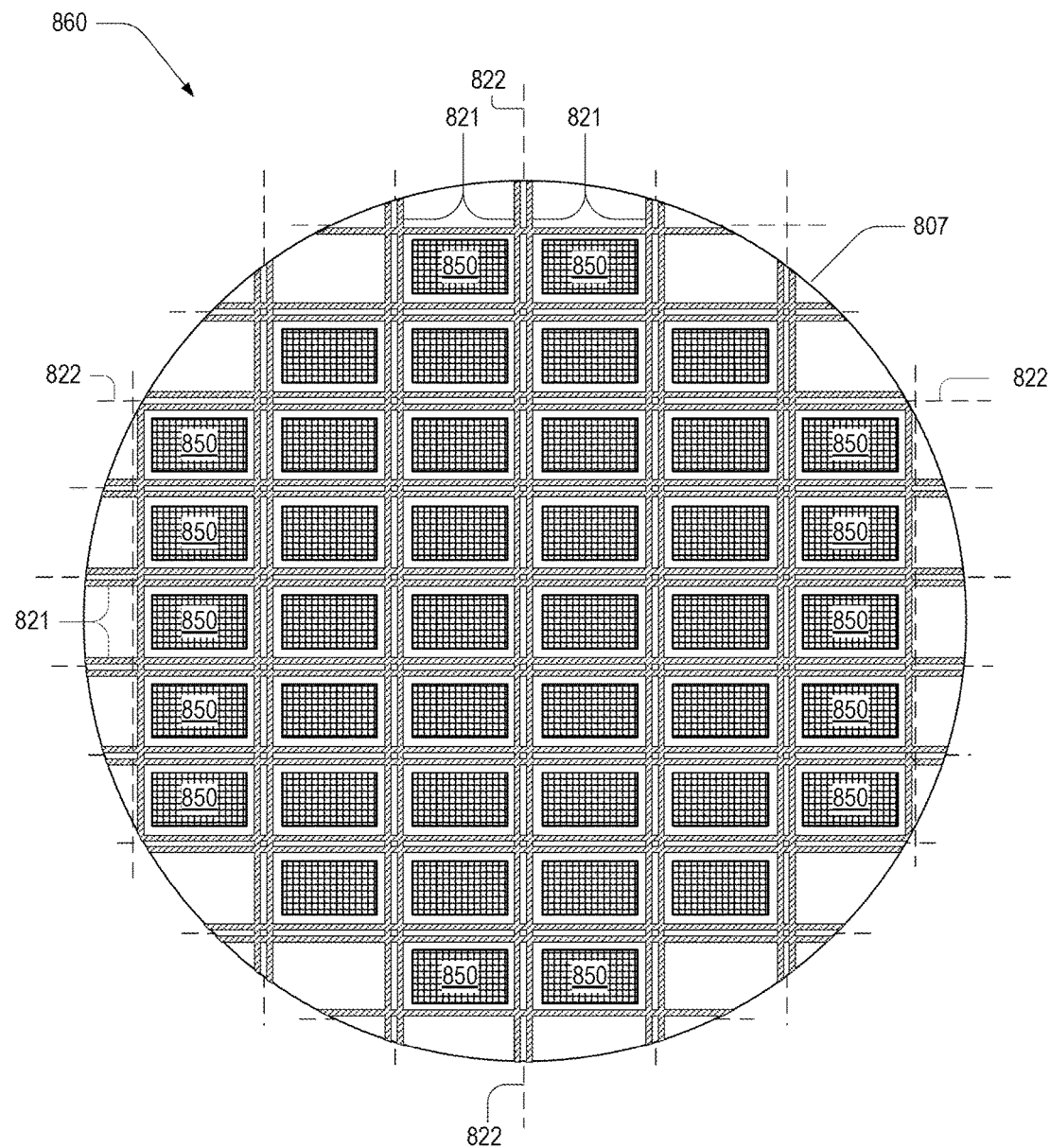
FIG. 8 is a plan view of a device wafer that includes a plurality of bare image sensors and a respective plurality of dams on a semiconductor wafer, in an embodiment.

FIG. 8 is a plan view of a device wafer 860 that includes a plurality of bare image sensors 850 on a semiconductor wafer 807. Each bare image sensor 850 is for example one bare image sensor 450 and includes one pixel array 104. For clarity of illustration, not all bare image sensors 850 are labelled in FIG. 8.

Step 702 is optional. In step 702, if included, method 700 prints a plurality of dams on a first side of semiconductor wafer and each along a side of a respective pixel array of a bare image sensor formed thereon. In an example of step 702, dams 821 are formed along a side of pixel arrays 104 of bare image sensors 850, as shown in FIG. 8. A scribe center line 822 is between dams 821. For clarity of illustration, not all dams 821 and scribe center lines 822 are labelled in FIG. 8. Dams 821 are similar to dams 421 of aerogel-encapsulated image sensor die 400.

In FIG. 8, each image sensor 850 has a single continuous dam along each of its four sides. In an alternate embodiment of device wafer 860, at least one dam 821 is not continuous across semiconductor wafer 807 such that an image sensor 850 has multiple discrete dams 821 along at least one of its sides. In an embodiment of device wafer 860, one or more of dams 821 are formed of a conductive material and are electrically connected to a respective bare image sensor 850. In a different embodiment of device wafer 860, one or more of dams 821 are formed of a semiconductor material.

In step 704, method 700 forms an aerogel layer on the bare image sensor. Step 704 may include forming an aerogel layer via a sol-gel process known in the art of aerogel formation. In an example of step 704, an aerogel layer 902 is formed on bare image sensors 850 to form an encapsulated device wafer 960, shown in FIG. 9.

Figure 9:
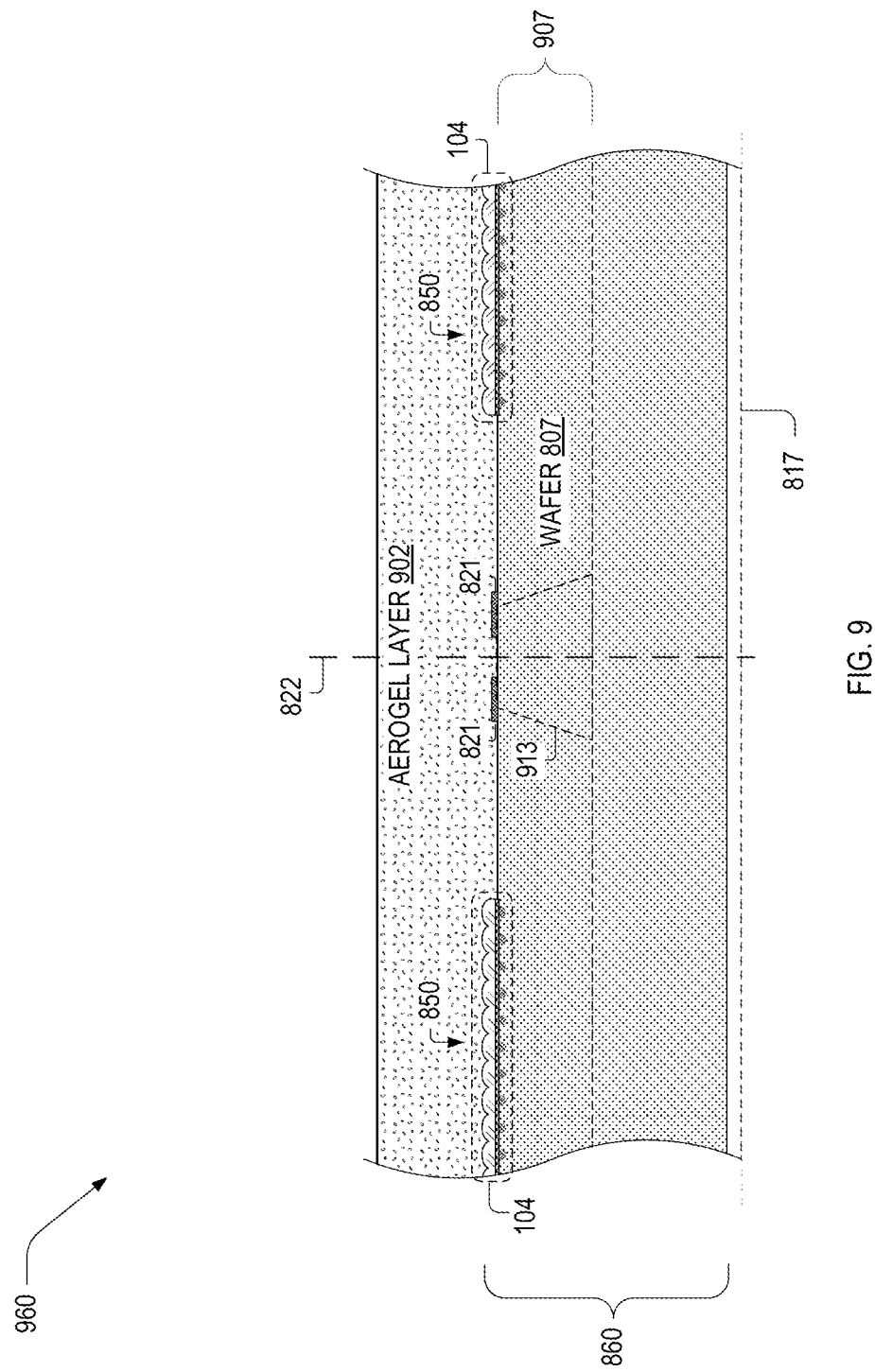
FIG. 9 is a cross-sectional view of a portion of the device wafer of FIG. 8 with an aerogel layer thereon, in an embodiment.

FIG. 9 is a cross-sectional view of a portion of encapsulated device wafer 960, which is device wafer 860 with aerogel layer 902 thereon. FIG. 9 shows two bare image sensors 850, respective associated pixel arrays 104, and two dams 821 therebetween. Aerogel layer 902, which may be applied by a step 704 of method 700, described below.

Aerogel layer 902 is similar to aerogel layer 402, FIG. 4. Aerogel layer 902 may be formed on bare image sensors 850 via processes that include methods known in the art such as spin-coating, dip-coating, and spray-coating as described, for example, by L. W. Hrubesh and J. F. Poco (1994) in "Processing and Characterization of High Porosity Aerogel Films," MRS Proceedings, 371, 195 (1994). Similarly, step 704 may include spin-coating, dip-coating, and spray-coating the aerogel layer on the bare image sensor.

Step 704 may include forming a solvent-filled gel film, an alcogel, for example. In embodiments of method 700 that include forming a solvent-filled gel film, step 704 may also include at least one of (a) supercritically drying the solvent-filled gel film, (b) drying the solvent-filled gel film via surface modification drying, and (c) pinhole drying the solvent-filled gel film. Step 704 may employ other drying methods known in the art of aerogel production without departing from the scope hereof. The solvent may be an alcohol such as polyethylene glycol, or others mentioned in the aforementioned reference by Pierre and Rigacci.

In an example of step 704, an aerogel layer 902 is spin-coated on bare image sensors 850 to form an encapsulated device wafer 960. When step 704 includes spin-coating and forming a solvent-filled gel film, step 704 may include spin coating an aerogel layer within an enclosure that has a solvent-saturated atmosphere, as discussed in the aforementioned reference by Hrubesh. In different example of step 704, aerogel layer 902 is dip-coated on bare image sensors 850. In different example of step 704, aerogel layer 902 is spray-coated on bare image sensors 850.

Step 706 is optional. In step 706, if included, method 700 thins the semiconductor wafer to form a thinned device wafer. In an example of step 706, semiconductor wafer 807 is thinned to remove a wafer portion 817 thereof. Step 706 yields a semiconductor wafer 907, which is semiconductor wafer 807 with portion 817 removed. Thinning semiconductor wafer 807 may be achieved by a backgrinding process, for example.

Embodiments of method 700 that include optional step 702 may also include optional step 720. In step 720, if included, method 700 electrically routes each dam to a second side of the semiconductor wafer, wherein the second side opposes the first side. Step 720 may include steps 708, 710, 712, 714, 716, and 718.

Figure 10:
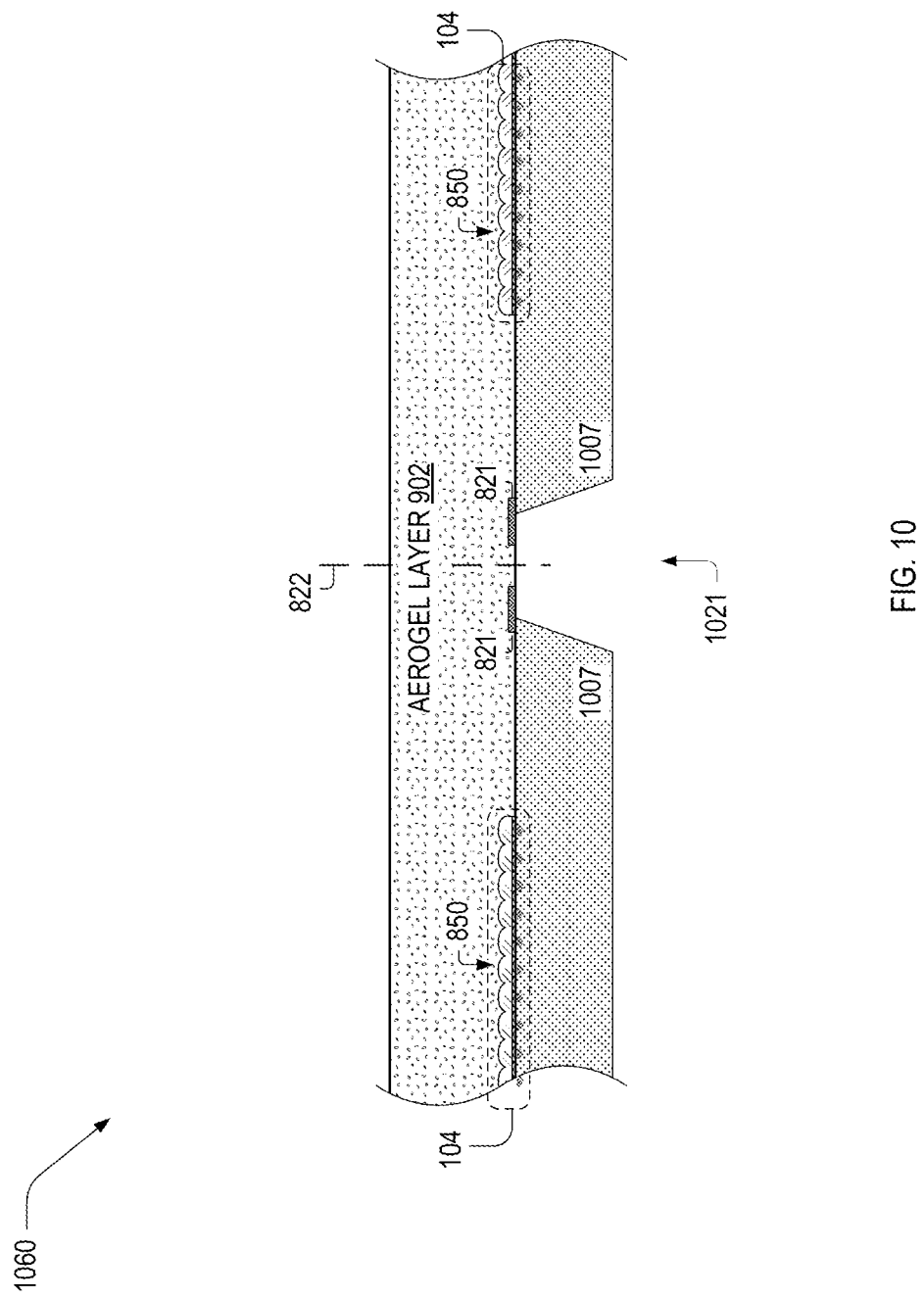
FIG. 10 is a cross-sectional view of the device wafer of FIG. 9 with the dams exposed through the semiconductor wafer, in an embodiment.

In step 708, method 700 exposes each dam by removing at least a portion of the semiconductor wafer. In an example of step 708, method 700 forms at least one notch 1021 in semiconductor wafer 907 that exposes dams 821, as shown in FIG. 10. Step 708 yields a semiconductor wafer 1007, which is semiconductor wafer 907 after the removal of with a wafer portion 913 (FIG. 9), and a device wafer 1060.

FIG. 10 is a cross-sectional view of device wafer 1060. Notch 1021 may be formed by etching semiconductor wafer 907 through a photolithographically patterned photoresist, for example. Step 706 may employ microfabrication etching technologies and methods including isotropic etching, anisotropic etching, wet etching, dry etching (e.g., reactive-ion etching, sputter etching, vapor-phase etching) and others known in the art.

Figure 11:
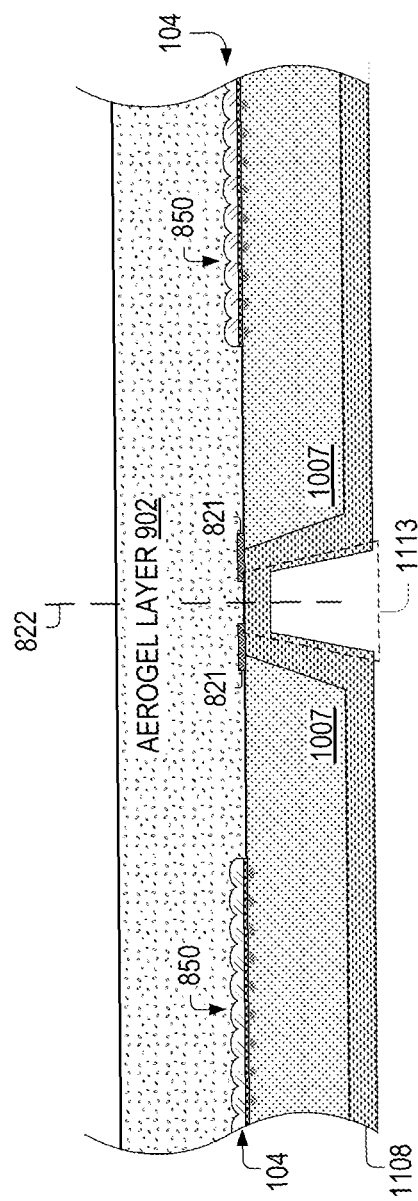
FIG. 11 is a cross-sectional view of the device wafer of FIG. 10, after covering the dams with an isolation layer, in an embodiment.

In step 710, method 700 forms an isolation layer over the removed portion of the semiconductor wafer. In an example of step 710, method 700 blanket-deposits an isolation layer 1108 on semiconductor wafer 1007 and exposed regions of dams 821, as shown in FIG. 11. It should be appreciated that an intermediate layer may be between isolation layer 1108 and semiconductor wafer 1007 without departing from the scope hereof.

FIG. 11 is a cross-sectional view of device wafer 860, after step 710 of method 700, which covers dams 821 with isolation layer 1108 such that they are no longer exposed. Isolation layer 1108 may be an oxide such as silicon dioxide, formed for example, by chemical vapor deposition or photochemical deposition or an organic material formed by coating or spray. Other layer deposition methods may be used without departing from the scope hereof.

Figure 12:
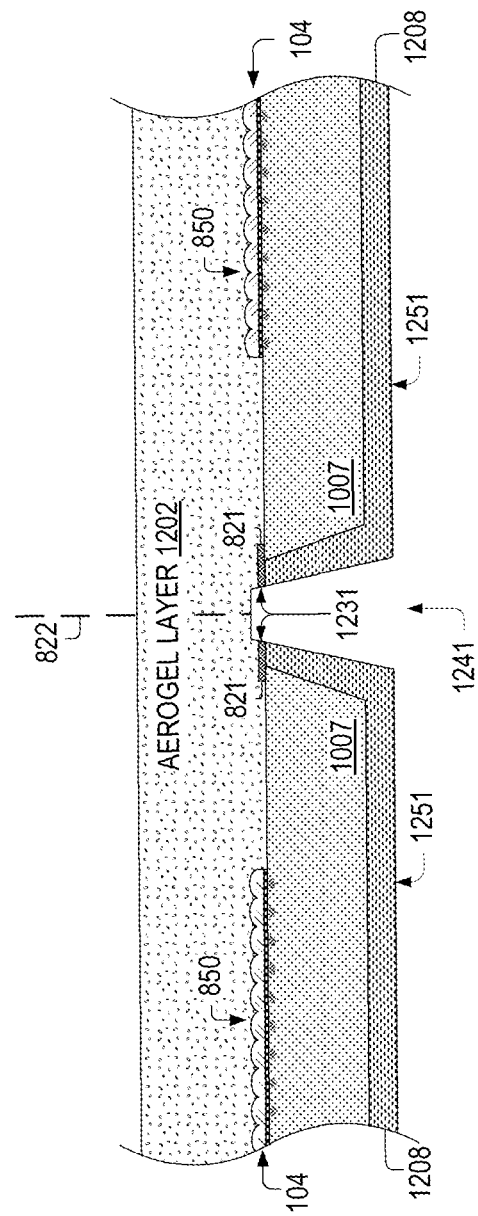
FIG. 12 is a cross-sectional view of device wafer of FIG. 11 after removing at least a portion of the isolation layer touching each dam, in an embodiment.

In step 712, method 700 exposes a surface of each dam by removing at least a portion of the isolation layer in contact thereto. In an example of step 712, method 700 exposes a surface 1231 of each dam 821 by removing at least a portion 1113 of isolation layer 1108, as shown in FIG. 12. FIG. 12 is a cross-sectional view of device wafer 860, after step 712 of method 700. In this example of step 712, the step of exposing a surface of each dam includes forming a notch 1241 in aerogel layer 902 and removing portions of dams 821 to expose dam surfaces 1231. Aerogel layer 1202 is aerogel layer 902 with a region between dams 821 removed. Isolation layer 1208 is isolation layer 1108 with portion 1113 (FIG. 11) removed, and is similar to isolation layer 408, FIG. 4. A surface 1251 of isolation layer 1208 is opposite aerogel layer 902.

In an embodiment of method 700, step 712 includes applying a patterned photoresist to the semiconductor wafer surface and etching notches therein. Etching may employ similar technologies and methods discussed regarding step 708. In an alternative to step 710, method 700 exposes a surface of each dam 821 by forming a through-silicon via (TSV) through semiconductor wafer 1007.

Figure 13:
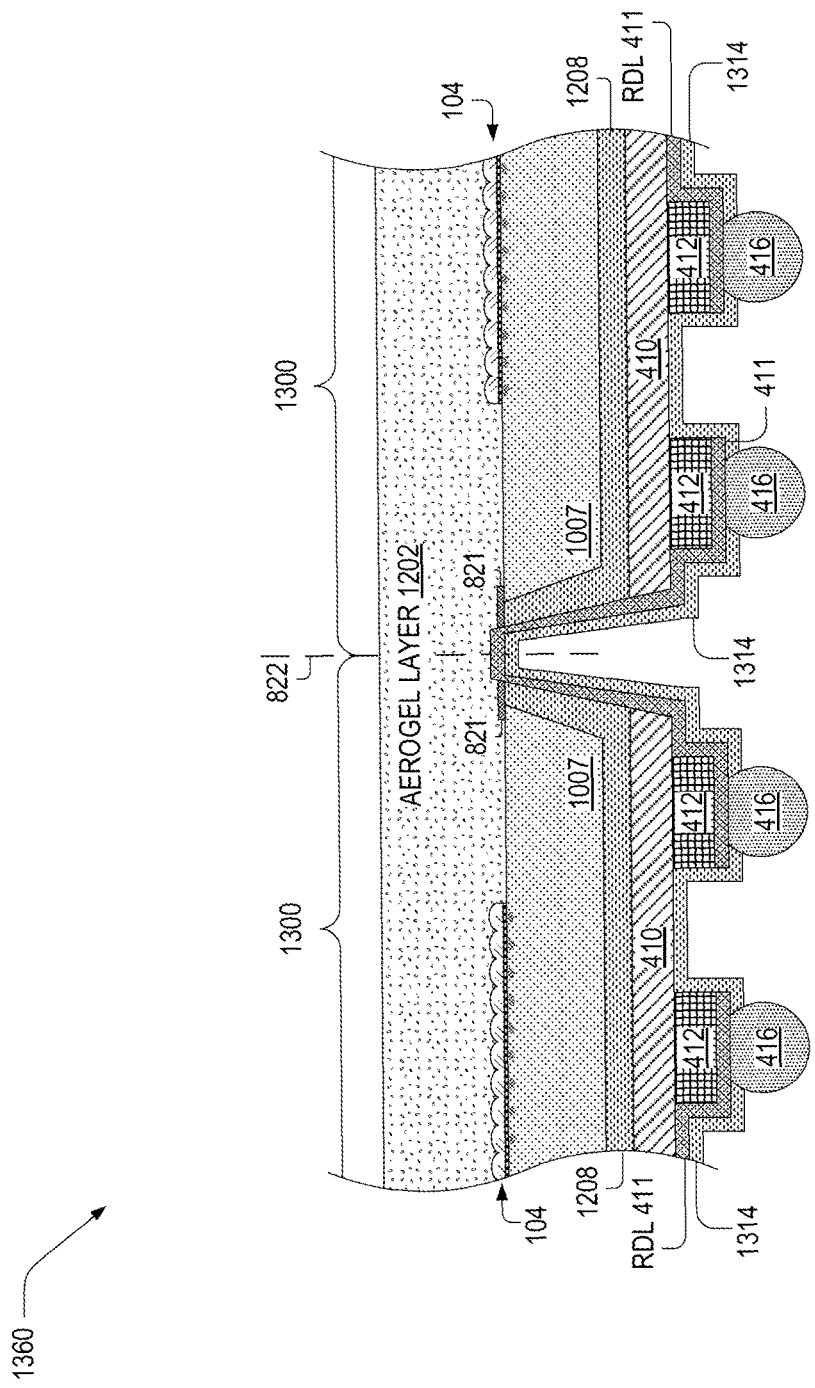
FIG. 13 is a cross-sectional view of a device wafer of FIG. 12 after electrically connecting a solder ball to each dam, in an embodiment.

FIG. 13 is a cross-sectional view of a device wafer 1360, after steps 714, 716, and 718 of method 700. In step 714, method 700 forms a layer on coplanar regions of the isolation layer. In an example of step 714, layer 410 is formed on coplanar regions of isolation layer 1208, as shown in FIG. 13.

In step 716, method 700 electrically connects a solder ball to each dam via a patterned RDL. In an example of step 716, solder balls 416 are each electrically connected to one dam 821 via a patterned RDL 411. Patterned RDL 411 is formed beneath isolation layer 1208, such that isolation layer 1208 is between patterned RDL 411 and semiconductor wafer 1007, as shown in FIG. 13. In an embodiment of method 700, method 700 forms barrier layers 412 on layer 410, such that a portion of patterned RDL 411 is between one solder ball 416 and barrier layer 412.

Step 716 results in device wafer 1360, which includes a plurality of unsingulated CSP image sensor dies 1300. Step 718 is optional. In step 718, if included, method 700 forms an isolation layer between adjacent solder balls. In an example of step 718, isolation layers 1314 are formed between adjacent solder balls 416.

Figure 14:
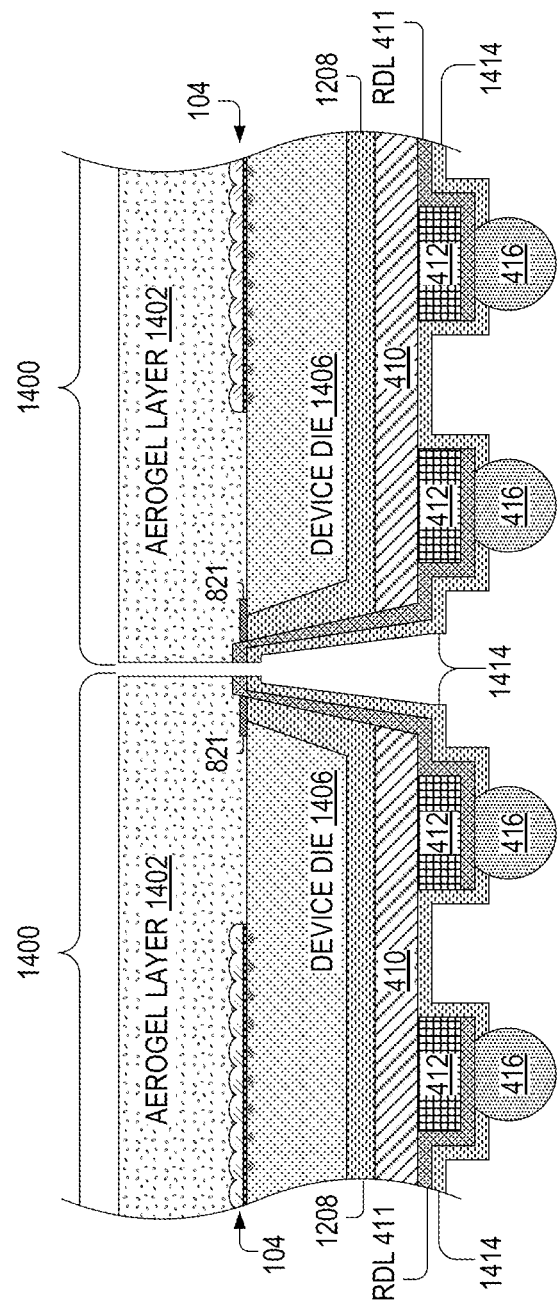
FIG. 14 is a cross-sectional view of a device wafer of FIG. 12 after singulating it to form a plurality of aerogel-encapsulated image sensor dies, in an embodiment.

Step 730 is optional. If included, in step 730, method 700 singulates the device wafer to form a plurality of aerogel-encapsulated image sensor dies. In an example of step 730, device wafer 1360 is singulated along scribe center line 822 to form a plurality of aerogel-encapsulated image sensor dies 1400, as shown in FIG. 14. Aerogel-encapsulated image sensor dies 1400 are similar to aerogel-encapsulated image sensor die 400. Each aerogel-encapsulated image sensor die 1400 includes a device die 1406, which is a singulated part of semiconductor wafer 1007 and is similar to device die 406. After step 730 each isolation layer 1314 is split into at least two isolation layer portions 1414 and aerogel layer 1202 is split into multiple aerogel layers 1402.

Combinations of Features

Features described above as well as those claimed below may be combined in various ways without departing from the scope hereof. The following examples illustrate some possible, non-limiting combinations:

(A1) An aerogel-encapsulated image sensor may include a device die with an image sensor fabricated thereon, and an aerogel layer that encapsulates the image sensor.

(A2) In the image sensor denoted as (A1), the aerogel layer may have a refractive index n satisfying $1.0 \leq n \leq 1.35$ at visible wavelengths.

(A3) In either or both of the image sensors denoted as (A1) and (A2), the aerogel layer may have a porosity of at least fifty percent.

(A4) In any of image sensors denoted as (A1) through (A3), the aerogel layer may have at least one of (a) an average pore width less than fifty nanometers and (b) a median pore width less than fifty nanometers.

(A5) In any of image sensors denoted as (A1) through (A4), the aerogel layer may include a plurality of pores occupying a pore volume within the aerogel layer, at least fifty percent of the pore volume coming from pores having radii smaller than five nanometers.

(A6) In any of image sensors denoted as (A1) through (A5), the aerogel layer may have a density between one and five hundred kilograms per cubic meter.

(A7) In any of image sensors denoted as (A1) through (A6), the aerogel layer may have a thickness between five hundred nanometers and two millimeters.

(A8) In any of image sensors denoted as (A1) through (A7), the aerogel layer may include at least one of silica, alumina, titania, and zirconia.

(B1) A method for encapsulating image sensor pixel arrays of respective bare image sensors formed on a sensor array sheet may include a step of injecting an uncured aerogel portion on each image sensor pixel array, and a step of curing each uncured aerogel portion.

(B2) In the method denoted as (B1), the step of curing may include at least one of (a) super-critical drying, (b) surface-modification drying, and (c) pinhole drying an uncured aerogel portion.

(B3) At least one of the methods denoted as (B1) and (B2) may further include singulating the sensor array sheet into a plurality of aerogel-encapsulated image sensors.

(C1) A method for encapsulating image sensor pixel arrays of respective bare image sensors on a device wafer may include forming an aerogel layer on each bare image sensor.

(C2) In the method denoted as (C1), the step of forming may include at least one of spin-coating, dip-coating, and spray-coating the aerogel layer on the bare image sensor.

(C3) In at either or both of the methods denoted as (C1) and (C2), the step of forming may include at least one of (a) super-critical drying, (b) surface-modification drying, and (c) pinhole drying a solvent-filled gel film.

(C4) Any of the methods denoted as (C1) through (C3) may further include singulating the device wafer to form a plurality of aerogel-encapsulated image sensor dies.

(C5) Any of the methods denoted as (C1) through (C4) may further include, before the step of forming, printing a plurality of dams on a first side of the device wafer along a side of an image sensor pixel array.

(C6) The method denoted as (C5) may further include electrically routing each dam to a second side of the device wafer, the second side opposing the first side.

(C7) In the methods denoted as (C6), the step of electrically routing may include electrically connecting a solder ball to each dam via a patterned redistribution layer.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. An aerogel-encapsulated image sensor comprising:
a device die having an image sensor that includes a plurality of pixels forming a pixel array;
an aerogel layer that encapsulates the image sensor such that the pixel array is between a bottom surface of the device die and the aerogel layer; and
a microlens array that includes a plurality of microlenses, each microlens aligned to a respective one of the plurality of pixels, the microlens array being between the pixel array and a region of the aerogel layer that (a) is located directly above the pixel array and (b) has a top outer surface that is part of a top outer surface of the aerogel-encapsulated image sensor.

2. The aerogel-encapsulated image sensor of claim 1, the aerogel layer having a refractive index n satisfying $1.0 \le n \le 1.1$ at visible wavelengths.

3. The aerogel-encapsulated image sensor of claim 1, the aerogel layer having a porosity of at least fifty percent.

4. The aerogel-encapsulated image sensor of claim 1, the aerogel layer having at least one of (a) an average pore width less than fifty nanometers and (b) a median pore width less than fifty nanometers.

5. The aerogel-encapsulated image sensor of claim 1, the aerogel layer including a plurality of pores occupying a pore volume within the aerogel layer, at least fifty percent of the pore volume coming from pores having radii smaller than five nanometers.

6. The aerogel-encapsulated image sensor of claim 1, the aerogel layer having a density between one and five hundred kilograms per cubic meter.

7. The aerogel-encapsulated image sensor of claim 1, the aerogel layer having a thickness between five hundred nanometers and two millimeters.

8. The aerogel-encapsulated image sensor of claim 1, the aerogel layer including at least one of silica, alumina, titania, and zirconia.

9. The aerogel-encapsulated image sensor of claim 1, the aerogel layer having a bottom surface that includes a bottom-surface region, opposite the top-surface region, and in direct contact with the image sensor.

10. The aerogel-encapsulated image sensor of claim 1, the region of the aerogel layer lacking, on a side opposite the microlens array, any layer thereon.

* * * * *